United States Patent
Williams et al.

(10) Patent No.: US 11,536,793 B2
(45) Date of Patent: Dec. 27, 2022

(54) CALIBRATION APPARATUS AND CALIBRATING CROSS-FREQUENCY PHASES OF LARGE-SIGNAL NETWORK ANALYZER MEASUREMENTS

(71) Applicant: Government of the United States of America, as represented by the Secretary of Commerce, Gaithersburg, MD (US)

(72) Inventors: Dylan Forrest Williams, Boulder, CO (US); Aric Warner Sanders, Broomfield, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 40 days.

(21) Appl. No.: 17/193,441

(22) Filed: Mar. 5, 2021

(65) Prior Publication Data
US 2021/0286036 A1  Sep. 16, 2021

Related U.S. Application Data

(60) Provisional application No. 62/988,447, filed on Mar. 12, 2020.

(51) Int. Cl.
*G01R 35/00* (2006.01)
*G01R 27/28* (2006.01)

(52) U.S. Cl.
CPC ........... *G01R 35/007* (2013.01); *G01R 27/28* (2013.01)

(58) Field of Classification Search
CPC .............................. G01R 35/007; G01R 27/28
See application file for complete search history.

(56) References Cited

U.S. PATENT DOCUMENTS 11,193,965 B2 * 12/2021 Pfaffeneder .......... H04B 17/309
2004/0066182 A1 * 4/2004 Evers ..................... G01R 23/14
324/76.23

(Continued)

OTHER PUBLICATIONS

Remley, K.A., et al., "A Precision Millimeter-Wave Modulated-Signal Source", 2013 IEEE MTT-S International Microwave Symposium Digest (MTT), 2013.

(Continued)

*Primary Examiner* — Akm Zakaria
(74) *Attorney, Agent, or Firm* — Office of Chief Counsel for National Institute of Standards and Technology (57) ABSTRACT

A calibration apparatus calibrates cross-frequency phases of large-signal network analyzer measurements and includes: a signal generator; a vector network analyzer that includes couplers and receivers that receive the calibration signal and the reference multitone signal from the signal generator; a calibration receiver that receives a calibration signal from the vector network analyzer and produces a digitized calibration temporal signal from the calibration signal; and a signal processor in communication with the signal generator and the vector network analyzer and that: receives the reference digitized signal from the reference receiver; receives the forward digitized signal from the forward coupled receiver; receives the reverse digitized signal from the reverse coupled receiver; receives the digitized calibration temporal signal from the calibration receiver; and produces a calibration factor from the reference digitized signal, the forward digitized signal, the reverse digitized signal, and the digitized calibration temporal signal.

22 Claims, 7 Drawing Sheets

(56) References Cited

U.S. PATENT DOCUMENTS

| | | | | |
|---|---|---|---|---|
| 2010/0041353 | A1* | 2/2010 | Alford | H04B 17/101 |
| | | | | 455/115.1 |
| 2017/0026137 | A1* | 1/2017 | Hind | H04B 17/103 |
| 2020/0103485 | A1* | 4/2020 | Anderson | G01R 35/00 |

OTHER PUBLICATIONS

Verbeyst, F., et al., "Next-Generation Comb Generators for Accurate Modulated Measurements", IEEE, 2013.

Hale, P.D., et al., "A Compact Millimeter-wave Comb Generator for Calibrating Broadband Vector Receivers", 2015 85th Microwave Measurement Conference (ARFIG), 2015, p. 1-4.

Reader, H.C., et al., "Comb-Generator Characterization", IEEE Transactions on Microwave Theory and Techniques, 2008, p. 515-521, vol. 56 No. 2.

Aldoumani, a., et al., "Operation and Calibration of VNA-based Large Signal RF I-V Waveform Measurements System without using a harmonic phase reference standard", IEEE, 2013.

Zhang, Y., et al., "Dense Spectral Grid NVNA Phase Measurements Using Vector Signal Generators", IEEE Transactions on Instrumentation and Measurement, 2014, p. 2983-2992, vol. 63 No. 12.

Zhang, Y., et al., "Characterization for Multiharmonic Intermodulation Nonlinearity of RF Power Amplifiers Using a Calibrated Nonlinear Vector Network Analyzer", IEEE Transactions on Microwave Theory and Techniques, 2016, p. 291 2-2923, vol. 64 No. 9.

Wang, C.M., et al., "Least-Squares Estimation of Time-Base Distortion of Sampling Oscilloscopes", IEEE Transactions on Instrumentation and Measurement, 1999, p. 1324-1332, vol. 48 No. 6.

Wang, C.M., et al., "Sequential Estimation of Timebase Corrections for an Arbitrarily Long Waveform", IEEE Transactions on Instrumentation and Measurement, 2012, p. 2689-2694, vol. 61 No. 10.

* cited by examiner

CALIBRATION APPARATUS AND CALIBRATING CROSS-FREQUENCY PHASES OF LARGE-SIGNAL NETWORK ANALYZER MEASUREMENTS

CROSS REFERENCE TO RELATED APPLICATIONS

The application claims priority to U.S. Provisional Patent Application Ser. No. 62/988,447 filed Mar. 12, 2020, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 975-2573; email tpo@nist.gov.

BRIEF DESCRIPTION

Disclosed is a calibration apparatus for calibrating cross-frequency phases of large-signal network analyzer measurements, the calibration system comprising: a signal generator that produces a calibration signal and a reference multitone signal; a vector network analyzer in communication with the signal generator and comprising a forward coupler, a reverse coupler, a forward coupled receiver, a reverse coupled receiver, and a reference receiver and that receives the calibration signal and the reference multitone signal from the signal generator; the forward coupler in communication with the signal generator and that receives the calibration signal from the signal generator and produces a forward coupled signal from the calibration signal; the forward coupled receiver in communication with the forward coupler and that receives the forward coupled signal from the forward coupler and produces a forward digitized signal from the forward coupled signal; the reverse coupler in communication with the signal generator and that receives the calibration signal from the signal generator and produces a reverse coupled signal from the calibration signal; the reverse coupled receiver in communication with the reverse coupler and that receives the reverse coupled signal from the reverse coupler and produces a reverse digitized signal from the reverse coupled signal; the reference receiver in communication with the signal generator and that receives the reference multitone signal from the signal generator and produces a reference digitized signal from the reference multitone signal; a calibration receiver in communication with the signal generator and the vector network analyzer and that receives the calibration signal from the vector network analyzer and produces a digitized calibration temporal signal from the calibration signal; and a signal processor in communication with the signal generator and the vector network analyzer and that: receives the reference digitized signal from the reference receiver; receives the forward digitized signal from the forward coupled receiver; receives the reverse digitized signal from the reverse coupled receiver; receives the digitized calibration temporal signal from the calibration receiver; and produces a calibration factor from the reference digitized signal, the forward digitized signal, the reverse digitized signal, and the digitized calibration temporal signal.

Disclosed is a process for calibrating cross-frequency phases of large-signal network analyzer measurements, the process comprising: producing, by a signal generator, a calibration signal and a reference multitone signal; a vector network analyzer in communication with the signal generator and comprising a forward coupler, a reverse coupler, a forward coupled receiver, a reverse coupled receiver, and a reference receiver and that receives the calibration signal and the reference multitone signal from the signal generator; receiving, by a forward coupler of a vector network analyzer, the calibration signal from the signal generator; producing, by the forward coupler, a forward coupled signal from the calibration signal; receiving, by a forward coupled receiver of the vector network analyzer, the forward coupled signal from the forward coupler; producing, by the forward coupled receiver, a forward digitized signal from the forward coupled signal; receiving, by a reverse coupler of the vector network analyzer, the calibration signal from the signal generator; producing, by the reverse coupler, a reverse coupled signal from the calibration signal; receiving, by a reverse coupled receiver of the vector network analyzer, the reverse coupled signal from the reverse coupler; producing, by the reverse coupled receiver, a reverse digitized signal from the reverse coupled signal; receiving, by a reference receiver of the vector network analyzer, the reference multitone signal from the signal generator; producing, by the reference receiver, a reference digitized signal from the reference multitone signal; receiving, by a calibration receiver, the calibration signal from the vector network analyzer; producing, by the calibration receiver, a digitized calibration temporal signal from the calibration signal; and receiving, by a signal processor, the reference digitized signal from the reference receiver; receiving, by the signal processor, the forward digitized signal from the forward coupled receiver; receiving, by the signal processor, the reverse digitized signal from the reverse coupled receiver; receiving, by the signal processor, the digitized calibration temporal signal from the calibration receiver; and producing, by the signal processor, a calibration factor from the reference digitized signal, the forward digitized signal, the reverse digitized signal, and the digitized calibration temporal signal to calibrate the cross-frequency phases of large-signal network analyzer measurements.

BRIEF DESCRIPTION OF THE DRAWINGS

The following description cannot be considered limiting in any way. With reference to the accompanying drawings, like elements are numbered alike.

DETAILED DESCRIPTION

A detailed description of one or more embodiments is presented herein by way of exemplification and not limitation.

Large-signal network analyzers (LSNA) add power and cross-frequency phase calibrations to a conventional vector-network-analyzer (VNA) scattering-parameter calibration. These calibration steps allow the LSNA to measure scattering parameters and the amplitude and phase of the forward and backward waves at the ports of the LSNA. LSNAs find applications in nonlinear device characterization, modulated-signal characterization, and the characterization of devices excited by modulated signals. While LSNAs are available in both sampler-based and mixer-based architectures, the mixer-based architectures are more common and can offer higher dynamic range. LSNAs can make use of comb generators to provide a constant set of constant-phase reference tones for the LSNA and to calibrate the cross-frequency phase of the LSNA. However, this may limit the LSNA to measurements to uniform commensurate frequency grids. As the frequency spacing is reduced, the total power available in the grid is also reduced, limiting the upper frequency limit of the LSNA calibration.

Lower-frequency pseudo-random bit sequences (PRBS) can trigger the comb, moving energy from the harmonics of the fundamental to a fine grid around the fundamental and a few harmonics of that fundamental. A similar approach can generate finely-spaced tones with a chirped input. While this allows for finer frequency grids, these approaches may not have flexibility in choice of the grid and can be limited in the total number and bandwidth of frequency points over which the LSNA can be calibrated and perform measurements. Adding a band-pass filter and amplifier after the comb generator may boost the power available to the LSNA over the bandwidth of the filter and amplifier that may be useful for band-limited signals but cannot be applied to perform measurements on arbitrary frequency grids. A multistep calibration that stitches multisine signals together in post-processing may provide broadband calibrations at fine tone spacings, but stitched multistep calibration processes can degrade calibration accuracy, particularly when they contain many stitched frequency bands.

It should be appreciated that a calibration apparatus and calibrating cross-frequency phases of large-signal network analyzer measurements described herein overcome these limitations by using an arbitrary waveform generator (AWG) to synchronize the measurement apparatus and providing direct calibration of the LSNA with a calibrated oscilloscope. This offers a practical and accurate way of transferring oscilloscope cross-frequency phase calibrations to LSNAs on arbitrary frequency grids, including arbitrary, irregularly-spaced, and fine frequency grids. The calibration apparatus and calibrating cross-frequency phases of large-signal network analyzer measurements overcome spacing and placement limitations of the calibration frequency grids in the conventional approaches to calibration of LSNAs, which uses comb generators to calibrate the cross-frequency phases of large-signal network analyzer measurements.

The calibration apparatus and calibrating cross-frequency phases of large-signal network analyzer measurements improves synchronization of large-signal network analyzers and transferring cross-frequency phase calibrations from a calibrated sampling oscilloscope to the large-signal network analyzer on an arbitrary frequency grid. Advantageously, the calibration apparatus and calibrating cross-frequency phases of large-signal network analyzer measurements can be applied to measurement of modulated signals and other waveforms on arbitrary and fine frequency grids. Further, the calibration apparatus and calibrating cross-frequency phases of large-signal network analyzer measurements provides measurement of complex and arbitrarily long signals traceably with high dynamic range.

Calibration apparatus 200 calibrates cross-frequency phases of large-signal network analyzer measurements. In an embodiment, with reference to FIG. 1, FIG. 2, FIG. 3, and FIG. 4, calibration apparatus 200 includes signal generator 201 that produces calibration signal 219 and reference multitone signal 217; vector network analyzer 205 in communication with signal generator 201 and including forward coupler 222, reverse coupler 225, forward coupled receiver 224, reverse coupled receiver 227, and reference receiver 231 and that receives calibration signal 219 and reference multitone signal 217 from signal generator 201; forward coupler 222 in communication with signal generator 201 and that receives calibration signal 219 from signal generator 201 and produces forward coupled signal 223 from calibration signal 219; forward coupled receiver 224 in communication with forward coupler 222 and that receives forward coupled signal 223 from forward coupler 222 and produces forward digitized signal 229 from forward coupled signal 223; reverse coupler 225 in communication with signal generator 201 and that receives calibration signal 219 from signal generator 201 and produces reverse coupled signal 226 from calibration signal 219; reverse coupled receiver 227 in communication with reverse coupler 225 and that receives reverse coupled signal 226 from reverse coupler 225 and produces reverse digitized signal 230 from reverse coupled signal 226; reference receiver 231 in communication with signal generator 201 and that receives reference multitone signal 217 from signal generator 201 and produces reference digitized signal 232 from reference multitone signal 217; calibration receiver 204 in communication with signal generator 201 and vector network analyzer 205 and that receives calibration signal 219 from vector network analyzer 205 and produces digitized calibration temporal signal 233 from calibration signal 219; and signal processor 228 in communication with vector network analyzer 205 and calibration receiver 204 and that: receives reference digitized signal 232 from reference receiver 231; receives forward digitized signal 229 from forward coupled receiver 224; receives reverse digitized signal 230 from reverse coupled receiver 227; receives digitized calibration temporal signal 233 from calibration receiver 204; and produces calibration factor 234 from reference digitized signal 232, forward digitized signal 229, reverse digitized signal 230, and digitized calibration temporal signal 233.

Figure 3:
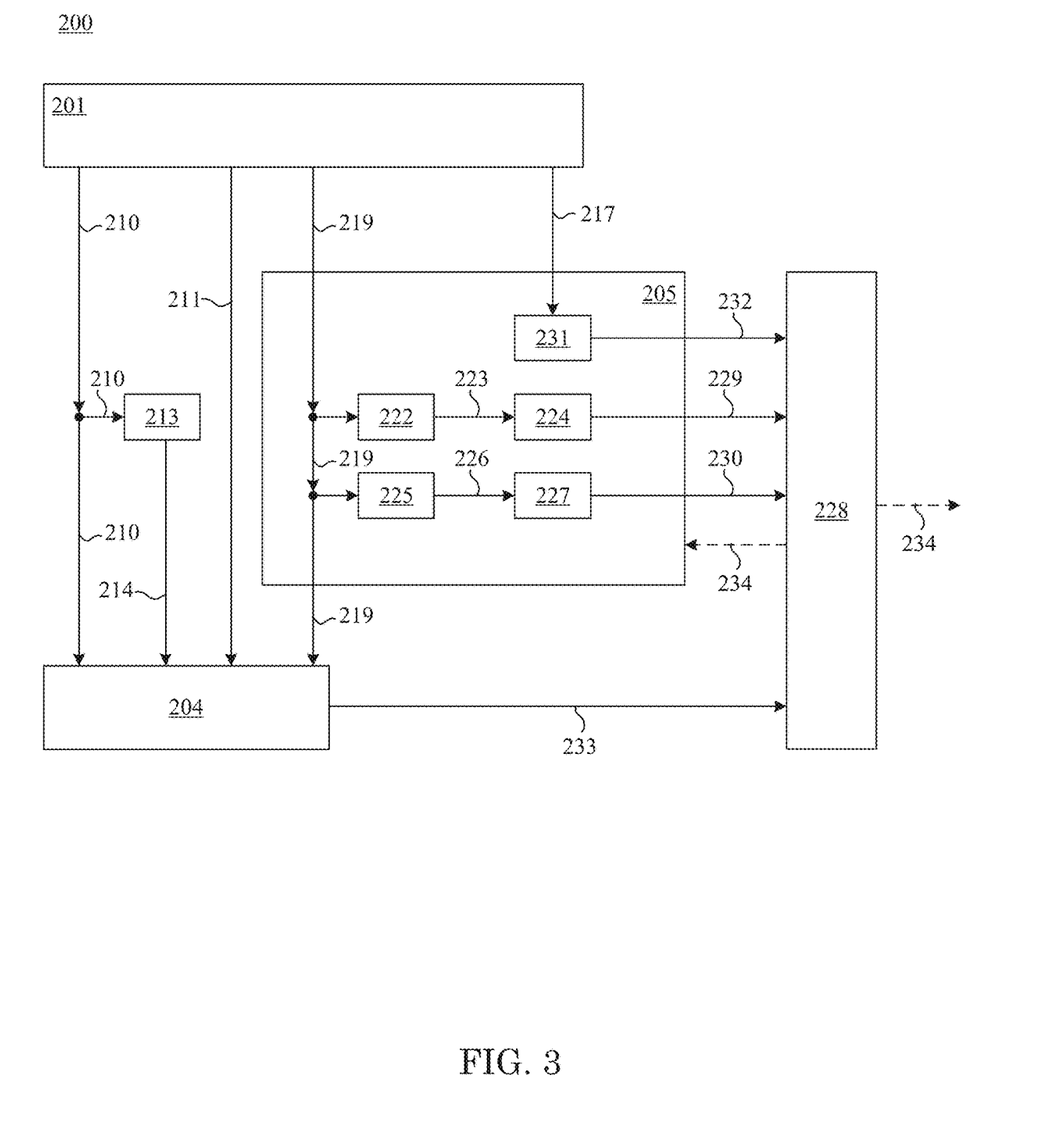
FIG. 3 shows a calibration apparatus.
Figure 4:
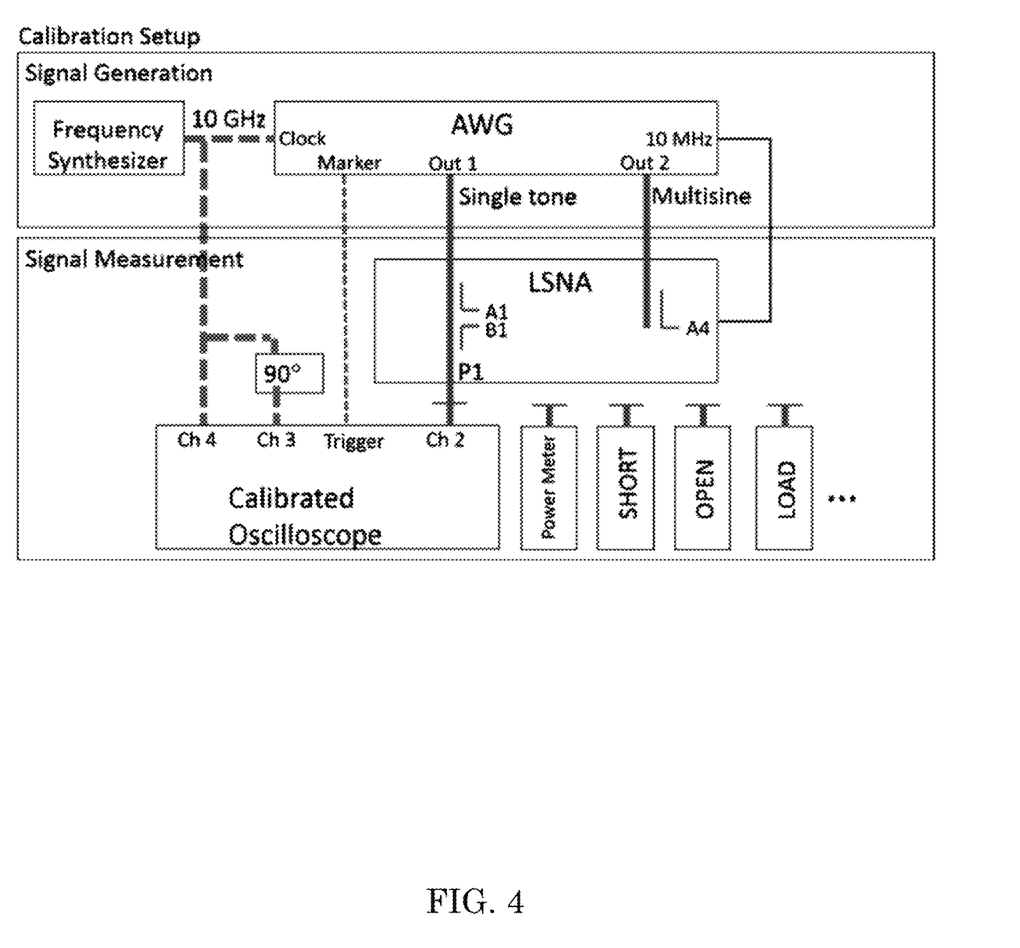
FIG. 4 shows a calibration apparatus, wherein after calibration, the oscilloscope, power meter, and scattering-parameter calibration standards are removeable so that the vector network analyzer can perform measurements on port P1.

In an embodiment, with reference to FIG. 3 and FIG. 4, calibration apparatus 200 includes phase shifter 213 in communication with signal generator 201 and calibration receiver 204, such that: signal generator 201 produces synchronization signal 210 and timing signal 211; phase shifter 213 receives synchronization signal 210 from signal generator 201 and produces phase shifted synchronization signal 214 from synchronization signal 210; and calibration receiver 204 receives synchronization signal 210 and timing signal 211 from signal generator 201, receives phase shifted synchronization signal 214 from phase shifter 213, triggers off of timing signal 211, and stabilizes timing based on phase shifted synchronization signal 214 and synchronization signal 210.

In an embodiment, calibration signal 219 includes a single tone sinusoid. Signal generator 201 can produce single tone sinusoid at each frequency to be measured by calibration receiver 204 and vector network analyzer 205. According to an embodiment, calibration receiver 204 measures a partial cycle, one cycle, or multiple cycles of single tone sinusoid. In an embodiment, signal processor 228 compares phases of the single tone sinusoid measured by vector network analyzer 205 and calibration receiver 204, wherein calibration factor 234 includes a cross-frequency phase calibration of vector network analyzer 205 to calibration receiver 204. In an embodiment, calibration signal 219 includes multitone sinusoids and calibration receiver 204 can measure one or more tones of the multitone sinusoid at once, and signal processor 228 can compare phases of the sinusoids in the single tone sinusoids measured by vector network analyzer 205 and calibration receiver 204, wherein calibration factor 234 includes a cross-frequency phase calibration of vector network analyzer 205 to calibration receiver 204. In an embodiment, reference multitone signal 217 from signal generator 201 includes a plurality of unknown, stable tones, and reference multitone signal 217 is a phase reference for signal generator 201.

In an embodiment, with reference to FIG. 4, calibration apparatus 200 includes a power meter, scattering-parameter calibration standards, or a combination of these.

Figure 2:
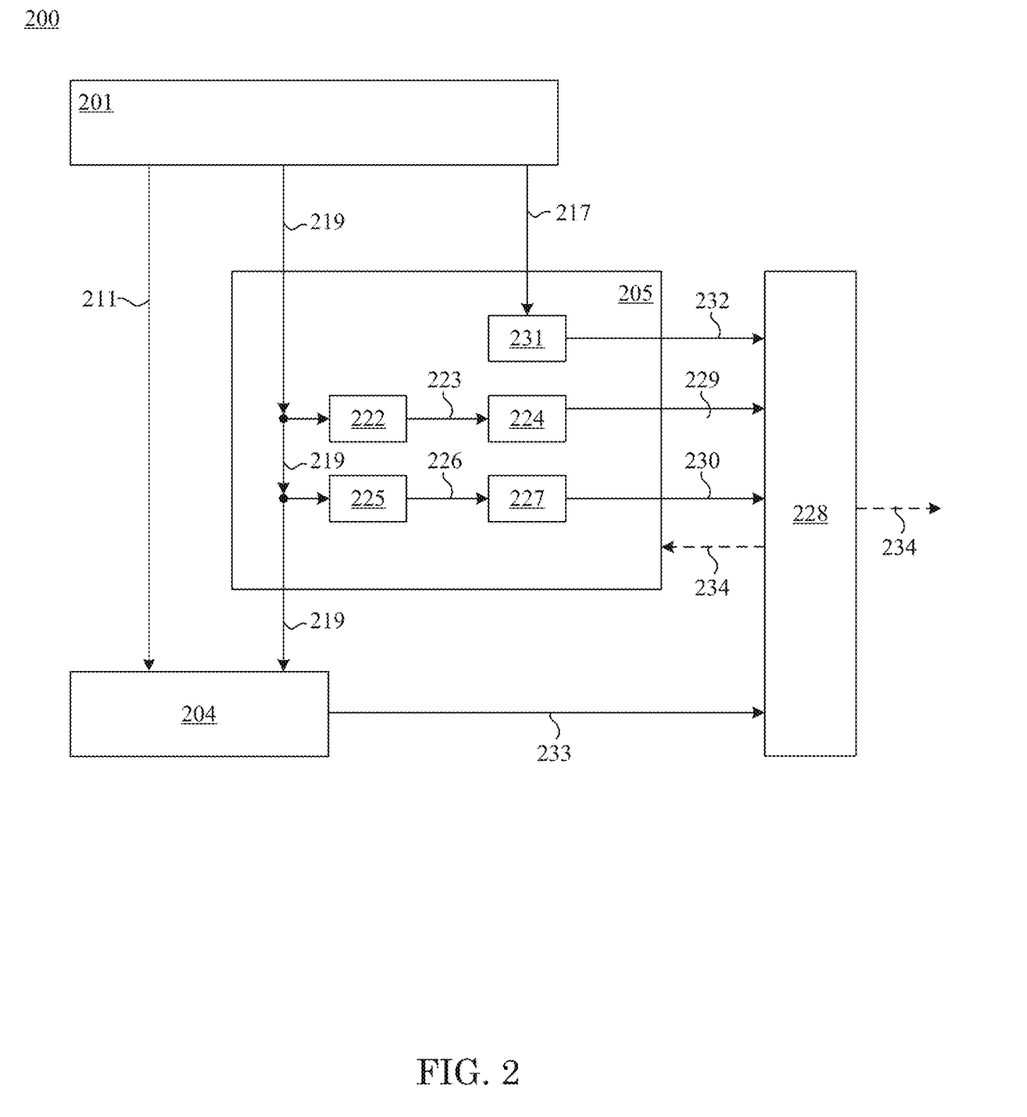
FIG. 2 shows a calibration apparatus.

In an embodiment, with reference to FIG. 2, FIG. 3, and FIG. 4, signal generator 201 produces a timing signal 211; and calibration receiver 204 receives timing signal 211 from signal generator 201, and triggers off of timing signal 211.

In an embodiment, with reference to FIG. 1, FIG. 2, FIG. 3, and FIG. 4, vector network analyzer 205 receives calibration factor 234 from signal processor 228 and calibrates forward digitized signal 229, reverse digitized signal 230, or reference digitized signal 232 based on calibration factor 234. According to an embodiment, vector network analyzer 205 applies calibration factor 234 from signal processor 228 to perform frequency-point-by-frequency-point calibration of a scattering-parameter and power.

Calibration apparatus 200 can be made from various components. Calibration apparatus 200 can be made from various elements and components. Signal generator 201 can include a device that produces electrical signals such as synchronization signal 210, timing signal 211, reference multitone signal 217, and calibration signal 219. Exemplary signal generators 201 include an arbitrary waveform generator, field programmable gate array, and the like. Timing signal 211 provides a trigger signal to calibration receiver 204 and can include an arbitrary waveform with a tailorable magnitude, duty cycle, a frequency. Synchronization signal 210 can be phase shifted by phase shifter 213 to produce phase shifted synchronization signal 214, wherein calibration receiver 204 stabilizes its time base based on synchronization signal 210 and phase shifted synchronization signal 214. In this manner synchronization signal 210 is temporally stable with a selected frequency such as 10 MHz. Instead of synchronization signal 210 being produced by signal generator 201, frequency synthesizer 216 be in communication with calibration receiver 204 and produce synchronization signal 210.

Calibration receiver 204 receives various electrical signals such as calibration signal 219 and produces digitized calibration temporal signal 233 from calibration signal 219. Timing of calibration receiver 204 can be based on a time base based on timing signal 211 or an internal time base established from calibration signal 219. Stabilization of the time base can be performed from synchronization signal 210 or phase shifted synchronization signal 214. In an embodiment, calibration receiver 204 is an oscilloscope. Digitized calibration temporal signal 233 includes a digized waveform of calibration signal 219 that has an absolute time scale and voltage scale, wherein in a graphical format digitized calibration temporal signal 233 can be displayed as a graph of absolute voltage versus time. Accordingly, digitized calibration temporal signal 233 can be compared with other signals by signal processor 228 to produce calibration factor 234.

Vector network analyzer 205 receives calibration signal 219 and reference multitone signal 217 and produces reference digitized signal 232, forward digitized signal 229, and reverse digitized signal 230. It is contemplated that signal processor 228 can be separate from vector network analyzer 205, or signal processor 228 can be part of vector network analyzer 205. Vector network analyzer 205 can include various receivers and couplers that receive forward signals, backward signals, and reference signals and produce waveforms therefrom that are used in combination with digitized calibration temporal signal 233 from calibration receiver 204 in calibration of vector network analyzer 205. Forward digitized signal 229 and reverse digitized signal 230 are the forward and backward components in the circuitry for the waveform of calibration signal 219 while reference multitone signal 217 includes multitone sinusoids. Reference receiver 231 receives reference multitone signal 217 and produces reference digitized signal 232 therefrom.

Signal processor 228 receives reference digitized signal 232, forward digitized signal 229, reverse digitized signal 230, and calibration factor 234 from which signal processor 228 produces calibration factor 234. Signal processor 228 can be a stand-alone or integrated computer processor that can perform analysis according to software instructions or integrated circuitry that performs specialized operations. Calibration factor 234 includes numerical quantities, analytical expressions, or tabular or textual data that used to calibrate vector network analyzer 205. calibration factor 234 can be contained in vector network analyzer 205 or communicated to an external device such as a storage medium or other hardware for immediate or delayed use.

Calibration apparatus 200 can be made in various ways. It should be appreciated that calibration apparatus 200 includes a number of optical, electrical, or mechanical components, wherein such components can be interconnected and placed in communication (e.g., optical communication, electrical communication, fluid communication, mechanical communication, and the like) by physical, chemical, optical, or free-space interconnects. The components can be disposed on mounts that can be disposed on a bulkhead for alignment or physical compartmentalization. As a result, calibration apparatus 200 can be disposed in a terrestrial environment or space environment.

In an embodiment, a process for making calibration apparatus 200 includes: connecting signal generator 201 in communication with vector network analyzer 205 by coaxial cable; connecting signal generator 201 in communication with calibration receiver 204 by coaxial cable; connecting signal processor 228 in communication with calibration receiver 204 and vector network analyzer 205 by coaxial cable; and optionally connecting phase shifter 213 to signal generator 201 and calibration receiver 204 by coaxial cable.

The process for making calibration apparatus 200 also can include additional timing signals to improve synchronization of signal generator 201, calibration receiver 204, and vector network analyzer 205; or adding upconverters to signal generator 201 to extend bandwidth.

Calibration apparatus 200 has numerous advantageous and unexpected benefits and uses. In an embodiment, a process for calibrating cross-frequency phases of large-signal network analyzer measurements includes: producing, by signal generator 201, calibration signal 219 and reference multitone signal 217 by using an arbitrary waveform generator programmed to generate calibration signal 219 and reference multitone signal 217; vector network analyzer 205 in communication with signal generator 201 and including forward coupler 222, reverse coupler 225, forward coupled receiver 224, reverse coupled receiver 227, and reference receiver 231 and that receives calibration signal 219 and reference multitone signal 217 from signal generator 201; receiving, by forward coupler 222 of vector network analyzer 205, calibration signal 219 from signal generator 201 by using the internal couplers, mixers or IF digitizers of vector network analyzer 205; producing, by forward coupler 222, forward coupled signal 223 from calibration signal 219 by using the internal couplers, receivers, mixers and IF digitizers of vector network analyzer 205; receiving, by forward coupled receiver 224 of vector network analyzer 205, forward coupled signal 223 from forward coupler 222 by using the internal couplers, receivers, mixers and IF digitizers of vector network analyzer 205; producing, by forward coupled receiver 224, forward digitized signal 229 from forward coupled signal 223 by using the internal couplers, receivers, mixers and IF digitizers of vector network analyzer 205; receiving, by reverse coupler 225 of vector network analyzer 205, calibration signal 219 from signal generator 201 by using the internal couplers, receivers, mixers and IF digitizers of vector network analyzer 205; producing, by reverse coupler 225, reverse coupled signal 226 from calibration signal 219 by using the internal couplers, receivers, mixers and IF digitizers of vector network analyzer 205; receiving, by reverse coupled receiver 227 of vector network analyzer 205, reverse coupled signal 226 from reverse coupler 225 by using the internal couplers, receivers, mixers and IF digitizers of vector network analyzer 205; producing, by reverse coupled receiver 227, reverse digitized signal 230 from reverse coupled signal 226 by using the internal couplers, receivers, mixers and IF digitizers of vector network analyzer 205; receiving, by reference receiver 231 of vector network analyzer 205, reference multitone signal 217 from signal generator 201 by using the internal couplers, mixers and IF digitizers of vector network analyzer 205 or by using just the internal receivers, mixers and IF digitizers of vector network analyzer 205 to improve sensitivity; producing, by reference receiver 231, reference digitized signal 232 from reference multitone signal 217 by using the internal couplers, receivers, mixers and IF digitizers of vector network analyzer 205 or by using just the internal receivers, mixers and IF digitizers of vector network analyzer 205 to improve sensitivity; receiving, by calibration receiver 204, calibration signal 219 from vector network analyzer 205 by using the internal couplers, receivers, mixers and IF digitizers of vector network analyzer 205; producing, by calibration receiver 204, digitized calibration temporal signal 233 from calibration signal 219 by using the internal couplers, receivers, mixers and IF digitizers of vector network analyzer 205; and receiving, by signal processor 228, reference digitized signal 232 from reference receiver 231 by internal digital hardware and firmware of vector network analyzer 205; receiving, by signal processor 228, forward digitized signal 229 from forward coupled receiver 224 by internal digital hardware and firmware of vector network analyzer 205; receiving, by signal processor 228, reverse digitized signal 230 from reverse coupled receiver 227 by way of the internal digital hardware and firmware of vector network analyzer 205; receiving, by signal processor 228, digitized calibration temporal signal 233 from calibration receiver 204 by internal digital hardware and firmware of vector network analyzer 205; and producing, by signal processor 228, calibration factor 234 from reference digitized signal 232, forward digitized signal 229, reverse digitized signal 230, and digitized calibration temporal signal 233 by internal digital hardware and firmware of vector network analyzer 205 to calibrate the cross-frequency phases of large-signal network analyzer measurements.

In an embodiment, calibrating cross-frequency phases of large-signal network analyzer measurements further includes producing, by signal generator 201, synchronization signal 210 and timing signal 211 by using an arbitrary waveform generator programmed to generate synchronization signal 210 and timing signal 211; receiving, by phase shifter 213, synchronization signal 210 from signal generator 201 by connecting the components with coaxial cables; producing, by phase shifter 213, phase shifted synchronization signal 214 from synchronization signal 210 by using a hybrid coupler or a signal splitter and different lengths of cables on each port of the signal splitter; receiving, by calibration receiver 204, synchronization signal 210 and timing signal 211 from signal generator 201 by connecting the components with a coaxial cable; receiving, by calibration receiver 204, phase shifted synchronization signal 214 from phase shifter 213 by connecting the components with a coaxial cable; triggering calibration receiver 204 from timing signal 211 by connecting the components with a coaxial cable; and stabilizing timing of calibration receiver 204 based on phase shifted synchronization signal 214 and synchronization signal 210 by signal processing software that corrects for time-base distortion and jitter.

In an embodiment, calibrating cross-frequency phases of large-signal network analyzer measurements includes calibrating: power measurement of vector network analyzer 205 with a power meter by connecting the power meter to output port of vector network analyzer 205 and recording readings of power from the power meter and vector network analyzer 205; or scattering-parameters of vector network analyzer 205 with scattering-parameter calibration standards by connecting scattering-parameter calibration standards to ports of vector network analyzer 205 and measuring reflection and transmission coefficients of scattering-parameters calibration standards with vector network analyzer 205.

In an embodiment, calibrating cross-frequency phases of large-signal network analyzer measurements includes producing, by signal generator 201, timing signal 211 by programming an arbitrary waveform generator to create timing signal 211; and receiving, by calibration receiver 204, timing signal 211 from signal generator 201 by connecting the timing signal created by an arbitrary waveform generator with a coaxial cable to a measurement port of calibration receiver 204; and triggering calibration receiver 204 off of timing signal 211 by using the internal trigger circuitry of calibration receiver 204.

In an embodiment, calibrating cross-frequency phases of large-signal network analyzer measurements includes receiving, by vector network analyzer 205, calibration factor 234 from signal processor 228 by transfer of digital information; and calibrating forward digitized signal 229, reverse digitized signal 230, or reference digitized signal 232 based on calibration factor 234 by applying calibration factors to digitized measurements performed by vector network analyzer 205.

In an embodiment, calibrating cross-frequency phases of large-signal network analyzer measurements includes applying, by vector network analyzer 205, calibration factor 234 from signal processor 228 to perform frequency-point-by-frequency-point calibration of a scattering-parameter and power by applying calibration factors to digitized measurements performed by vector network analyzer 205. According to an embodiment, calibration signal 219 includes a single tone sinusoid.

In an embodiment, calibrating cross-frequency phases of large-signal network analyzer measurements includes producing, by signal generator 201, single tone sinusoid at each frequency to be measured by calibration receiver 204 and vector network analyzer 205 by programming an arbitrary waveform generator to create single tone sinusoid.

In an embodiment, calibrating cross-frequency phases of large-signal network analyzer measurements includes measuring, by calibration receiver 204, part of a cycle, one cycle, or more than once cycle of single tone sinusoid by using the samplers and other hardware in an oscilloscope.

In an embodiment, calibrating cross-frequency phases of large-signal network analyzer measurements includes measuring, by calibration receiver 204, multitone calibration signal 219 by using the samplers and other hardware in an oscilloscope.

In an embodiment, calibrating cross-frequency phases of large-signal network analyzer measurements includes comparing, by signal processor 228, phases of the single tone sinusoid measured by vector network analyzer 205 and calibration receiver 204 by comparing these phases to those of reference multitone signal 217, such that calibration factor 234 includes a cross-frequency phase calibration of vector network analyzer 205 to calibration receiver 204. It is contemplated that reference multitone signal 217 from signal generator 201 includes a plurality of unknown, stable tones, and reference multitone signal 217 is a phase reference for signal generator 201.

The process for calibrating cross-frequency phases of large-signal network analyzer measurements also can include performing mismatch corrections based on measurements performed by vector network analyzer 205, time-base correction algorithms based on measurements of synchronization signal 210 by oscilloscope.

Calibration apparatus 200 and processes disclosed herein have numerous beneficial uses, including calibrated traceable measurements of long modulated signals performed on arbitrary frequency grids. Advantageously, calibration apparatus 200 overcomes limitations of technical deficiencies of conventional compositions such as electrical comb generators. Further, calibration apparatus 200 overcomes the problems with simultaneously attaining adequate power, broad bandwidths and closely spaced tones in the frequency domain.

Beneficially, calibration apparatus 200 and calibrating cross-frequency phases of large-signal network analyzer measurements is applicable to any frequency grid that can be generated by an AWG. The phase lock of calibration apparatus 200 can be implemented at high frequencies (e.g., 10 GHz), lowering phase noise. The AWG can provide power at frequencies of interest, greatly increasing the signal-to-noise ratio compared to conventional comb-based approaches and lifting restrictions on the upper frequency limit and tone spacing. Calibration apparatus 200 can be operated at the highest frequency that can be measured by a calibrated oscilloscope, e.g., about 110 GHz. Vector network analyzer 205 can be calibrated with single-tone signals on an arbitrary frequency grid for more than a cycle, making them fast and easy to measure on the sampling oscilloscope, or multitone signals, allowing for more frequency points to be measured before uploading new signals into the AWG. Calibration receiver 204, e.g., the sampling oscilloscope, can be calibrated directly with a calibrated photodiode, eliminating comb generators from the traceability path. It is contemplated that calibration apparatus 200 can be directly calibrated and operated on wafer to the highest frequency at which electro-optic sampling can be used to provide the phase calibration as calibration receiver 204 in place of the oscilloscope, currently about 1 THz.

Calibration apparatus 200 and processes herein unexpectedly diverse applications to a broad range of signals with no restriction on the frequency grid. Moreover, calibration apparatus 200 provides excellent dynamic range and speed during the calibration process due to the high power achievable in each frequency tone in calibration signal 219 and the ability to only generate tones needed in calibration signal 219.

The articles and processes herein are illustrated further by the following Example, which non-limiting.

EXAMPLE

Large-Signal-Network-Analyzer Phase Calibration on an Arbitrary Grid.

A calibration apparatus provides a practical and accurate way of calibrating the cross-frequency phases of large-signal network analyzer measurements on arbitrary, irregularly-spaced, and fine frequency grids. Calibration with calibration apparatus overcomes spacing and placement limitations of the calibration frequency grids inherent in the current approach to LSNA calibration, which uses comb generators to calibrate the cross-frequency phases of large-signal network analyzer measurements.

FIG. 4 shows the measurement apparatus during calibration. During calibration, the AWG provides sinusoids to the LSNA at Out 1. These are used to perform the standard frequency-point-by-frequency-point LSNA scattering-parameter and power calibrations on port 1 (P1) of the LSNA. These sinusoids from the AWG Out 1 are also used to provide a sinusoid at each frequency that can be measured by both the oscilloscope and the LSNA, a process in which the oscilloscope need only measure one cycle of the sinusoid. A comparison of the phases of the sinusoid measured by the LSNA and the oscilloscope is used to transfer the oscilloscope's cross-frequency phase calibration to the LSNA.

The AWG in FIG. 4 provides synchronization for the measurement apparatus in a similar manner to. It generates a 10 MHz or other lock signal for the VNA and the oscilloscope trigger signal. The frequency synthesizer also creates the precision 10 GHz IQ reference signals for correcting for time-base-distortion for the oscilloscope using the methods of and the clock signal for the AWG.

Figure 1:
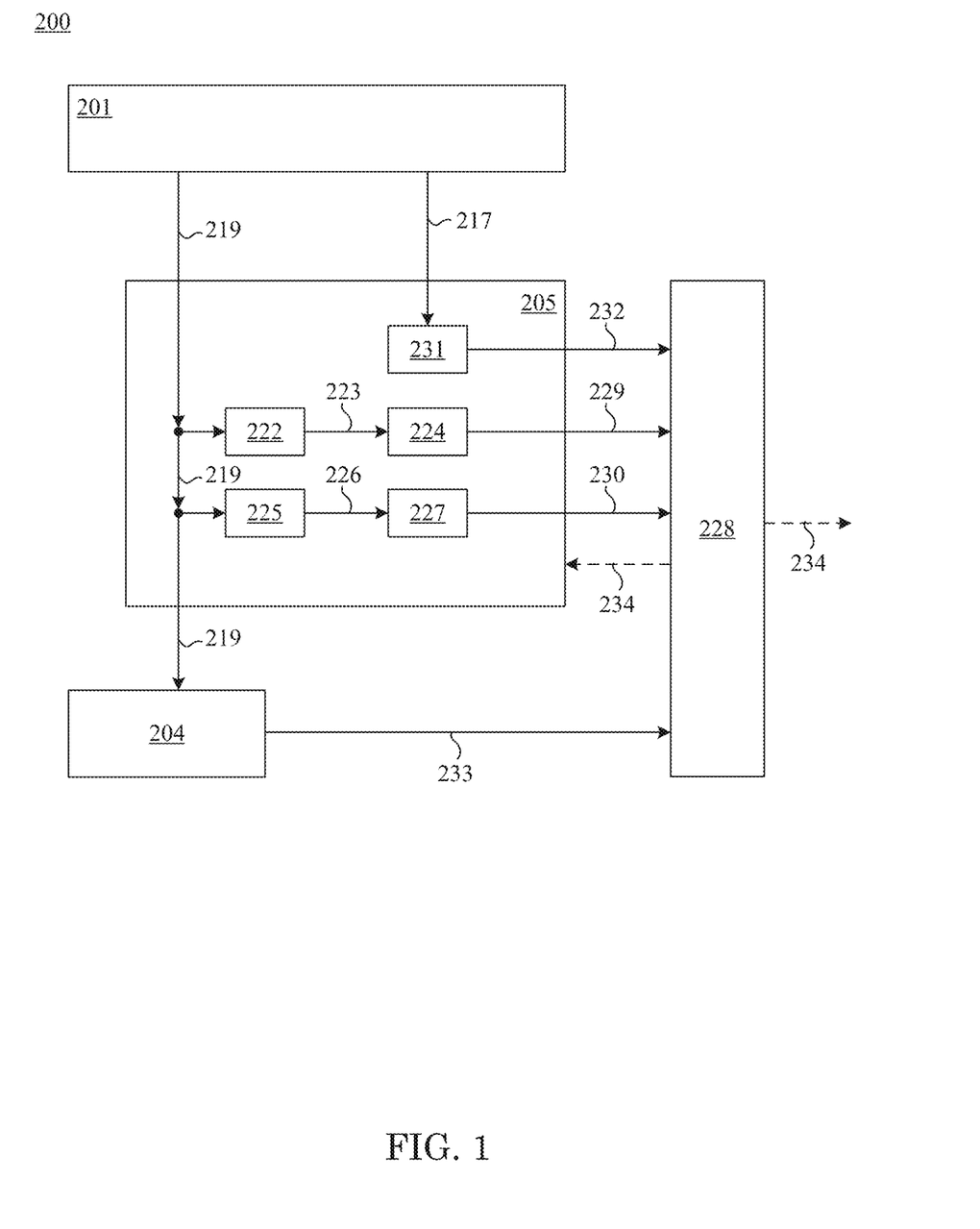
FIG. 1 shows a calibration apparatus.

After calibration with the oscilloscope, power meter, and scattering-parameter calibration standards (shown as an open, short and load in the figure), these calibration standards can be disconnected and the LSNA used to measure modulated forward-wave and backward-wave signals on port 1 of the LSNA (labeled P1 in FIG. 1). These signals on P1 can be generated by the AWG on Out 1 or externally by other instruments or devices that are locked to the frequency synthesizer or AWG.

During both calibration and measurement, the AWG provides a multisine reference signal on Out 2 for the LSNA with tones at each of the frequencies of interest. This signal serves as a phase reference for the LSNA as it makes measurements. The purpose of this phase reference is to provide the LSNA with a set of unknown but stable tones to use as a reference for other signals it measures. In postprocessing each phase measured by the LSNA on P1 is referred to the fixed phase of the tone at the same frequency generated on the AWG's Out 2, minimizing the need accuracy in the LSNA's 10 MHz reference. To minimize distortion in the LSNA, we used a Schroeder multisine to keep the peak-to-average power ratio low.

A multisine measurement provides tone spacing that corresponds to the standard minimum spacing of available comb generators, 10 MHz. This allows easy comparison to the sampling oscilloscope calibrated measurements. Then, we illustrate the method on a 25 kHz grid, which requires an exceedingly long sampling oscilloscope measurement (40 μs total time) and highlights the strength of our method.

The oscilloscope was calibrated with a photodiode calibrated on the National Institute of Standards and Technology's electro-optic sampling (EOS) system. The LSNA was calibrated as above with scattering-parameter artifacts, a power meter, and the EOS-calibrated oscilloscope, from which we transferred the phase calibration to the LSNA. The apparatus measured several multisines centered at 1 GHz.

Figure 5:
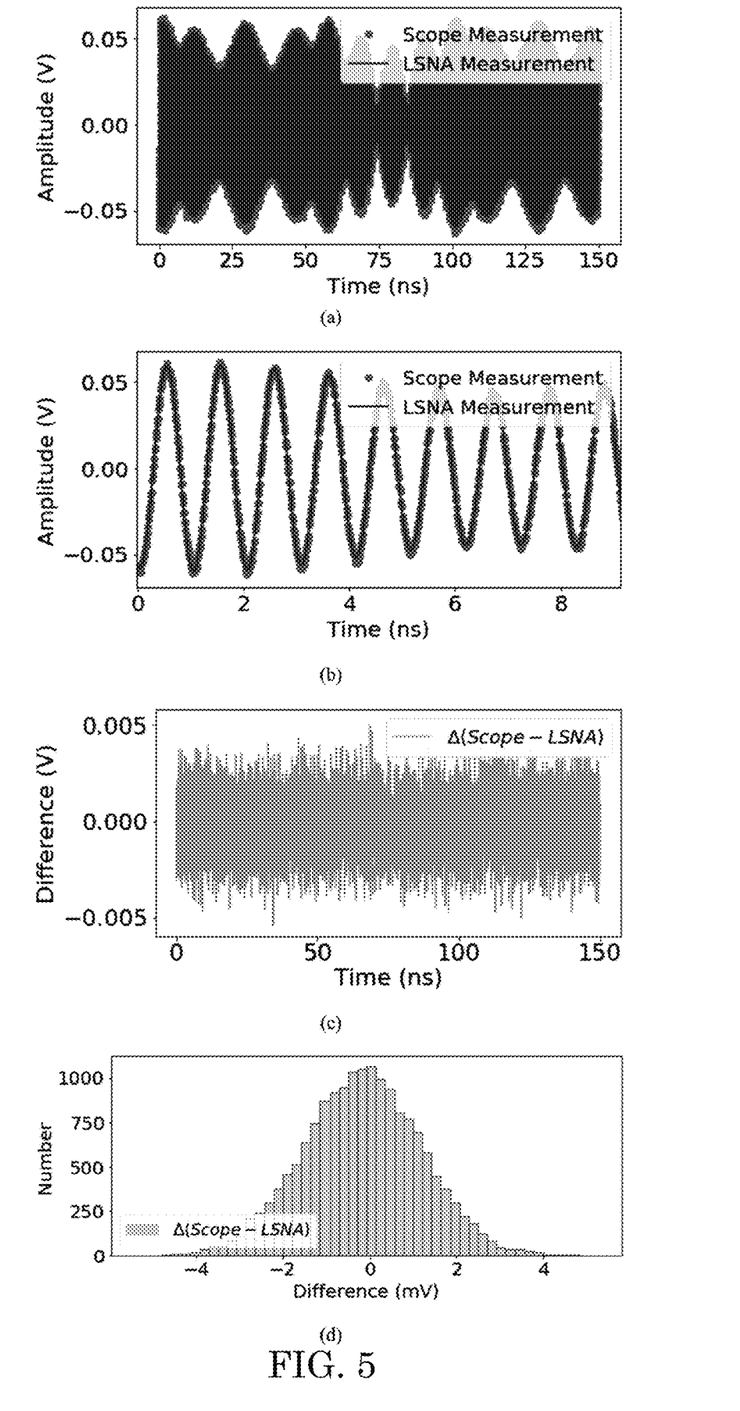
FIG. 5 shows time-domain comparisons of an 11-tone 10 MHz multisine measured by the LSNA and oscilloscope. (a) Signal envelope. (b) Closeup of the signal. The time-base correction algorithm moves points off of a regular grid. (c) The difference of the scope and LSNA measurements. (d) Histogram of the difference of the scope and LSNA measurements, with a mean of 0.2 mV and standard deviation of 1.4 mV.

After completing the calibrations, we generated an 11-tone Schroeder multisine on Out 1 of the AWG and measured that multisine with both the LSNA and the calibrated oscilloscope. FIG. 5 compares the direct measurement of the signal with the oscilloscope after time-base and mismatch corrections to the measurement performed by the LSNA after transformation to the time domain. FIG. 5(a) shows that the two instruments measure nearly the same 100 ns long envelope. FIG. 5(b) shows a closeup view of the actual signals measured by the two instruments. The two signals overlap to such a great extent that it is almost impossible to tell the difference in the plot. FIG. 5(c) shows that the difference of the two measurements is small and has no discernible structure. The histogram in FIG. 5(d) shows the difference to be approximately Gaussian with a mean of 0.2 mV and a standard deviation of 1.4 mV, much smaller than the roughly 100 mV peak-to-peak amplitude of the signal, identical to the residual distribution of a multisine fit of the oscilloscope and close to the 1.3 mV rms noise specification of the manufacturer.

Figure 6:
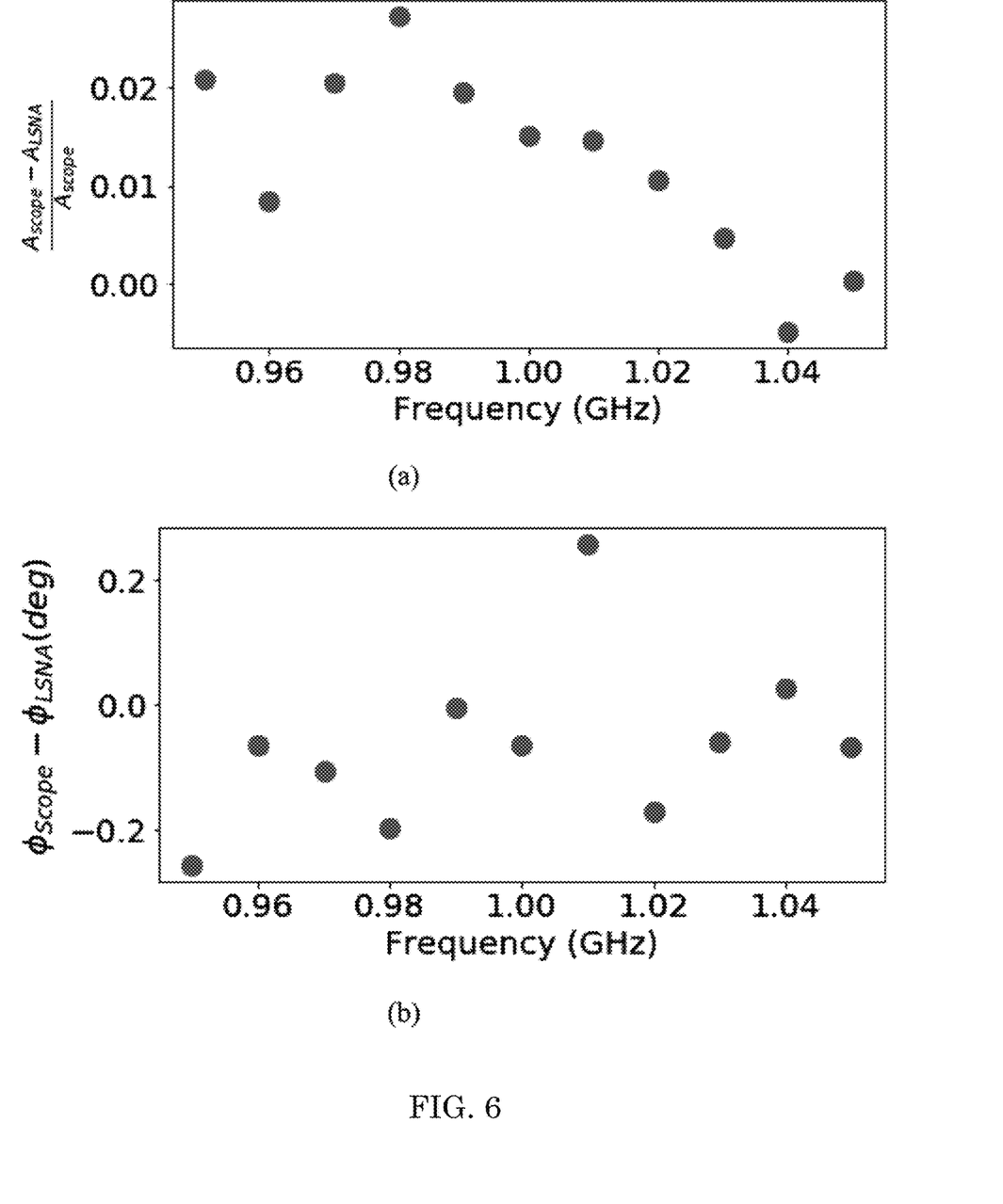
FIG. 6 shows frequency-domain comparison of the 11-tone 10 MHz multisine measured by the LSNA and oscilloscope. (a) Fractional difference in the voltage measurements. (b) Phase difference of the two measurements.

We examined results in the frequency domain to better assess the consistency of the LSNA and oscilloscope power-meter calibrations and the accuracy of the transfer of the oscilloscope's cross-frequency phase calibration to the LSNA. FIG. 6(a) shows that the fractional difference of the forward-wave voltage measurements made by the oscilloscope ($A_{Scope}$) and the LSNA ($A_{LSNA}$) are within about 2% of each other. FIG. 6(b) shows that the differences in phase measured by the LSNA and oscilloscope differ by less than a quarter of a degree, despite that fact that the phase at each frequency point in the calibration was calibrated separately. These phase differences correspond to a drift of less than 1 ps in the synchronization of the measurement apparatus.

Figure 7:
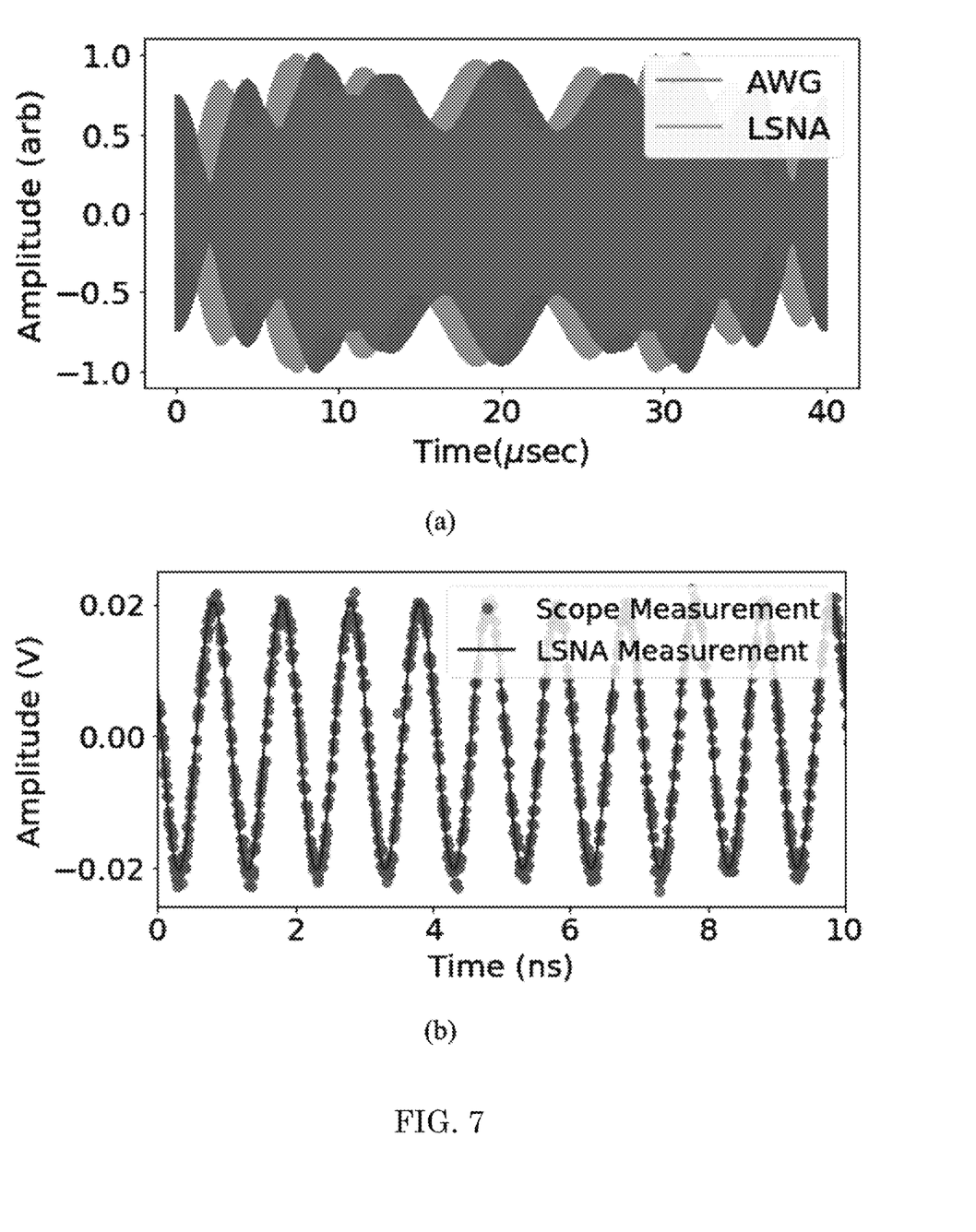
FIG. 7 shows time-domain comparison of an 11-tone 25 kHz multisine. (a) Temporal envelope uploaded to AWG and measured by LSNA, offset caused by path delay. (b) Time-domain comparison of LSNA and oscilloscope measurements. The time-base correction algorithm reassigns time points based on the 10 GHz signal from the frequency synthesizer.

We also created an 11-tone Schroeder multisine on the AWG with a 25 kHz tone spacing. FIG. 7(a) compares the envelope of the signal we uploaded to the AWG and measured with the LSNA. The time offset is due to the various hardware between the AWG's converters and the LSNA's calibration reference plane at P1. This 25 kHz narrow tone spacing resulted in a signal with a 40 μs repetition rate, too long to measure accurately with our sampling oscilloscope. However, because of the way that the measurement apparatus is synchronized by the AWG, we were able to measure portions of the signal with our oscilloscope and compare those to the temporal signal reconstructed by the LSNA, as shown in FIG. 7(b). Here again, the comparison is excellent, even at the narrow tone spacing of this multisine.

The calibration apparatus provides a fast, accurate and practical way of calibrating the cross-frequency phases of LSNAs on any frequency grid that can be generated with an AWG and measuring any repetitive communications signal that we can create with the instrument. We used an AWG to synchronize the measurements and then transferred the cross-frequency phase calibration of the oscilloscope to the LSNA. We verified the approach with two 11-tone multisines having 10 MHz and 25 kHz tone spacings, demonstrating that we could transfer the phase calibration of the oscilloscope to the LSNA over a wide range of tone spacing to within accuracy of a fraction of a degree.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A calibration apparatus for calibrating cross-frequency phases of large-signal network analyzer measurements, the calibration apparatus comprising:
    a signal generator that produces a calibration signal and a reference multitone signal;
    a vector network analyzer in communication with the signal generator and comprising a forward coupler, a reverse coupler, a forward coupled receiver, a reverse coupled receiver, and a reference receiver and that receives the calibration signal and the reference multitone signal from the signal generator;
    the forward coupler in communication with the signal generator and that receives the calibration signal from the signal generator and produces a forward coupled signal from the calibration signal;
    the forward coupled receiver in communication with the forward coupler and that receives the forward coupled signal from the forward coupler and produces a forward digitized signal from the forward coupled signal;
    the reverse coupler in communication with the signal generator and that receives the calibration signal from the signal generator and produces a reverse coupled signal from the calibration signal;
    the reverse coupled receiver in communication with the reverse coupler and that receives the reverse coupled signal from the reverse coupler and produces a reverse digitized signal from the reverse coupled signal;
    the reference receiver in communication with the signal generator and that receives the reference multitone signal from the signal generator and produces a reference digitized signal from the reference multitone signal;
    a calibration receiver in communication with the signal generator and the vector network analyzer and that receives the calibration signal from the vector network analyzer and produces a digitized calibration temporal signal from the calibration signal; and
    a signal processor in communication with the vector network analyzer and the calibration receiver and that:
        receives the reference digitized signal from the reference receiver;
        receives the forward digitized signal from the forward coupled receiver;
        receives the reverse digitized signal from the reverse coupled receiver;
        receives the digitized calibration temporal signal from the calibration receiver; and
        produces a calibration factor from the reference digitized signal, the forward digitized signal, the reverse digitized signal, and the digitized calibration temporal signal.

2. The calibration apparatus of claim 1, further comprising a phase shifter in communication with the signal generator and the calibration receiver, such that:
    the signal generator produces a synchronization signal and a timing signal;
    the phase shifter receives the synchronization signal from the signal generator and produces a phase shifted synchronization signal from the synchronization signal; and
    the calibration receiver receives the synchronization signal and the timing signal from the signal generator, receives the phase shifted synchronization signal from the phase shifter, triggers off of the timing signal, and stabilizes timing based on the phase shifted synchronization signal and the synchronization signal.

3. The calibration apparatus of claim 1, further comprising a power meter, scattering-parameter calibration standards, or a combination of these.

4. The calibration apparatus of claim 1, wherein the signal generator produces a timing signal; and
    the calibration receiver receives the timing signal from the signal generator, and triggers off of the timing signal.

5. The calibration apparatus of claim 1, wherein the vector network analyzer receives the calibration factor from the signal processor and calibrates the forward digitized signal, the reverse digitized signal, or the reference digitized signal based on the calibration factor.

6. The calibration apparatus of claim 5, wherein the vector network analyzer applies the calibration factor from the signal processor to perform frequency-point-by-frequency-point calibration of a scattering-parameter and power.

7. The calibration apparatus of claim 1, wherein the calibration signal comprises a single tone sinusoid.

8. The calibration apparatus of claim 7, wherein the signal generator produces the single tone sinusoid at each frequency to be measured by the calibration receiver and the vector network analyzer.

9. The calibration apparatus of claim 8, wherein the calibration receiver measures one cycle of the single tone sinusoid.

10. The calibration apparatus of claim 9, wherein the signal processor compares phases of the single tone sinusoid measured by the vector network analyzer and the calibration receiver, such that the calibration factor comprises a cross-frequency phase calibration of the vector network analyzer to the calibration receiver.

11. The calibration apparatus of claim 9, wherein the reference multitone signal from the signal generator comprises a plurality of unknown, stable tones, and the reference multitone signal is a phase reference for the signal generator.

12. A process for calibrating cross-frequency phases of large-signal network analyzer measurements, the process comprising:
    producing, by a signal generator, a calibration signal and a reference multitone signal;
    a vector network analyzer in communication with the signal generator and comprising a forward coupler, a reverse coupler, a forward coupled receiver, a reverse coupled receiver, and a reference receiver and that receives the calibration signal and the reference multitone signal from the signal generator;
    receiving, by a forward coupler of a vector network analyzer, the calibration signal from the signal generator;
    producing, by the forward coupler, a forward coupled signal from the calibration signal;

receiving, by a forward coupled receiver of the vector network analyzer, the forward coupled signal from the forward coupler;

producing, by the forward coupled receiver, a forward digitized signal from the forward coupled signal;

receiving, by a reverse coupler of the vector network analyzer, the calibration signal from the signal generator;

producing, by the reverse coupler, a reverse coupled signal from the calibration signal;

receiving, by a reverse coupled receiver of the vector network analyzer, the reverse coupled signal from the reverse coupler;

producing, by the reverse coupled receiver, a reverse digitized signal from the reverse coupled signal;

receiving, by a reference receiver of the vector network analyzer, the reference multitone signal from the signal generator;

producing, by the reference receiver, a reference digitized signal from the reference multitone signal;

receiving, by a calibration receiver, the calibration signal from the vector network analyzer;

producing, by the calibration receiver, a digitized calibration temporal signal from the calibration signal; and receiving, by a signal processor, the reference digitized signal from the reference receiver;

receiving, by the signal processor, the forward digitized signal from the forward coupled receiver;

receiving, by the signal processor, the reverse digitized signal from the reverse coupled receiver;

receiving, by the signal processor, the digitized calibration temporal signal from the calibration receiver; and producing, by the signal processor, a calibration factor from the reference digitized signal, the forward digitized signal, the reverse digitized signal, and the digitized calibration temporal signal to calibrate the cross-frequency phases of large-signal network analyzer measurements.

13. The process of claim 12, further comprising:
producing, by the signal generator, a synchronization signal and a timing signal;
receiving, by a phase shifter, the synchronization signal from the signal generator;
producing, by the phase shifter, a phase shifted synchronization signal from the synchronization signal;
receiving, by the calibration receiver, the synchronization signal and the timing signal from the signal generator;
receiving, by the calibration receiver, the phase shifted synchronization signal from the phase shifter;
triggering the calibration receiver from the timing signal; and
stabilizing timing of the calibration receiver based on the phase shifted synchronization signal and the synchronization signal.

14. The process of claim 12, further comprising calibrating: power measurement of the vector network analyzer with a power meter; or scattering-parameters of the calibration receiver with scattering-parameter calibration standards.

15. The process of claim 12, further comprising:
producing, by the signal generator, a timing signal; and
receiving, by the calibration receiver, the timing signal from the signal generator; and
triggering the calibration receiver off of the timing signal.

16. The process of claim 12, further comprising:
receiving, by the vector network analyzer, the calibration factor from the signal processor; and
calibrating the forward digitized signal, the reverse digitized signal, or the reference digitized signal based on the calibration factor.

17. The process of claim 16, further comprising applying, by the vector network analyzer, the calibration factor from the signal processor to perform frequency-point-by-frequency-point calibration of a scattering-parameter and power.

18. The process of claim 12, wherein the calibration signal comprises a single tone sinusoid.

19. The process of claim 18, further comprising producing, by the signal generator, the single tone sinusoid at each frequency to be measured by the calibration receiver and the vector network analyzer.

20. The process of claim 19, further comprising measuring, by the calibration receiver, one cycle of the single tone sinusoid.

21. The process of claim 20, comparing, by the signal processor, phases of the single tone sinusoid measured by the vector network analyzer and the calibration receiver, such that the calibration factor comprises a cross-frequency phase calibration of the vector network analyzer to the calibration receiver.

22. The process of claim 20, wherein the reference multitone signal from the signal generator comprises a plurality of unknown, stable tones, and the reference multitone signal is a phase reference for the signal generator.

* * * * *